US005137110A

United States Patent [19]

Bedard, Jr. et al.

[11] Patent Number: 5,137,110

[45] Date of Patent: Aug. 11, 1992

[54] HIGHLY DIRECTIONAL SOUND PROJECTOR AND RECEIVER APPARATUS

[75] Inventors: Alfred J. Bedard, Jr.; Randall T. Nishiyama, both of Boulder, Colo.

[73] Assignees: University of Colorado Foundation, Inc., Boulder, Colo.; The United States of America as represented by the Secretary of Commerce, Washington, D.C.

[21] Appl. No.: 574,857

[22] Filed: Aug. 30, 1990

[51] Int. Cl.$^{5}$ ........................ H05K 5/00; G10K 11/00; A47B 81/06; H04R 25/00

[52] U.S. Cl. .................................... 181/153; 181/184; 181/199; 381/154; 381/162

[58] Field of Search ............... 181/153, 155, 152, 158, 181/182, 184, 199, 148, 198, 185; 381/154, 159, 162

[56] References Cited

U.S. PATENT DOCUMENTS

| | | | |
|---|---|---|---|
| 1,795,874 | 3/1931 | Mason | 181/185 |
| 1,847,284 | 3/1932 | Volf, Jr. | 181/148 X |
| 1,876,466 | 9/1932 | Moore | 181/148 X |
| 2,262,146 | 4/1957 | Massa | 181/198 X |
| 2,789,651 | 4/1957 | Daniels | 181/198 X |
| 2,939,922 | 6/1960 | Gorike | 181/158 X |
| 3,793,489 | 2/1974 | Sank | 381/155 X |
| 4,421,957 | 12/1983 | Wallace, Jr. | 181/182 X |
| 4,555,598 | 1/1985 | Flanagan et al. | 181/158 X |

*Primary Examiner*—L. T. Hix
*Assistant Examiner*—Jae N. Noh
*Attorney, Agent, or Firm*—William H. Wright; Diana M. Cox

[57] ABSTRACT

An acoustic apparatus (10) adapted for use as either a sound projector or a sound receiver. The apparatus (10) comprises a bundle (20) of individual sound tubes (21, 22) disposed in a tube array unit (14) which rests on a support unit (13) operatively engaged with an acoustic unit (11). Only the ends of the individual sound tubes (21, 22) are provided wiht a plurality of spaced discrete sound ports (25).

9 Claims, 3 Drawing Sheets

HIGHLY DIRECTIONAL SOUND PROJECTOR AND RECEIVER APPARATUS

TECHNICAL FIELD

The present invention relates to the field of directional microphones and receivers, and in particular to an improved way of dimensioning and configuring an acoustic apparatus depending upon the particular mode of operation of the apparatus.

BACKGROUND ART

As can be seen by reference to the following U.S. Pat. Nos. 2,262,146, 2,939,922, 3,793,489, 4,421,957, and 4,555,598, the prior art is replete with myriad and diverse directional microphone and receiver constructions.

While all of the aforementioned prior art constructions are more than adequate for the basic purpose and function for which they have been specifically designed, these prior art constructions are uniformly deficient with respect to the directivity and sensitivity of their acoustic profile and the results that are generated.

There are a variety of needs for high power acoustic sources having high directivity. These needs include sound sources for remote sensing application where intense acoustic energy directed through the atmosphere can be used to provide information on winds, turbulence, temperature structure and perhaps other parameters.

Another area of use is in the area of communication and crowd control. Highly directed, high level sound can help guide rescue activities or provide emergency information even in noise environments. A third example of an application is use at outdoor concerts to direct the energy towards the audience and minimize annoyance to areas surrounding such events. Modifications to such arenas intended to reduce noise are typically quite expensive and not very effective.

Past devices intended to direct high intensity sound waves are typically large, awkward devices having poor directivity. Approaches used typically include arrays of conventional loudspeakers. Use of large numbers of individual speakers can be quite expensive. For remote sensing applications large horns (e.g., 12 feet in diameter) and dishes have been used to direct sound in the desired direction.

These remote sensing sources produce levels potentially damaging to hearing and the energy has proven annoying to those in surrounding areas at distances greater than one mine. Also, these remote sensing sources are susceptible to problems with rain, snow and hail since large areas of these radiators are exposed. For crowd control and emergency desired communication applications, we know of no sound source that is small enough to be conveniently transported and pointed in the desired direction.

As a consequence of the foregoing situation, there has existed a longstanding need for a generically configured apparatus for both directional sound projectors and receivers which will provide enhanced performance characteristics and the provision of such a construction is a stated objective of the present invention.

DISCLOSURE OF THE INVENTION

Remote sensing applications require high power acoustic sources for probing the atmosphere to high altitudes. Such acoustic sources are currently being operated over a wide frequency range from about 100 Hz to 2 kHz and there is a need for continuous, all-weather operation. There are significant problems caused by the high sound levels created in terms of both potential ear damage and annoyance. Attempts at shielding conventional loud speakers and horns have not been successful because it did not prove practical to attenuate sound from side lobes, vibration, diffraction, and scattering in an effective way. We have developed a highly directional sound projector in order to help solve these problems. The present apparatus consists of a bundle of tubes of incrementally increasing length all originating from the same chamber.

The actual apparatus operates as theoretically predicted and offers a number of advantages over conventional speakers and horns. These advantages include: side lobe suppression; smaller diameter relative to speakers and horns with similar directivity; ease of deployment so that it can be mechanically pointed in a desired direction; and small enough so that numbers of projectors can be mounted together in arrays at close spacings to further reduce side lobes and improve directivity.

We have also developed and tested a combination of designs that provide high directivity although having a small acoustic "footprint" relative to conventional sound sources (such as horns, dishes or speakers). The designs summarized below offer weather protection and can be made lightweight and portable.

One application involved a tapered single tube with ports along the tube. The tube starts out with a large diameter and tapers in steps to a small diameter at the end. The combination of port sizes and diameter changes insures that the individual ports act equally as individual sound sources along the length. Random spacing between individual ports further reduced side lobes.

It was also discovered that arrays of single tube designs can further increase directivity. We have built a source consisting of an array of 4 closely spaced tubes mounted on a platform that could be pointed in any direction desired. These tubes were made using PVC pipe and were light and relatively low cost to build.

We have also devised the technique of using closely spaced arrays of individual tubes with many ports near the end farthest from the driver. These tubes are made relatively large in diameter to reduce internal losses and are intended for source applications where high acoustic powers and high source efficiencies are required.

The technique of using a large number of small radiation ports near the end of each tube distributes the acoustic radiation uniformly along the axis of the tube while keeping the total of large tubes required to a practical number. This approach provides good directivity with effective side lobe reduction. This source can be operated with the end of each tube capped or uncapped.

Variations of these designs can also be applied to special applications (e.g., where extremely high directivity is required, we use a long bundle of tubes driven by a horn at the base.

This approach can also produce a very high degree of acoustic directivity by employing an array of tubes to phase sound from an acoustic drive preferably along a forward axis.

In addition, this approach produces high directivity using an area or footprint much smaller than other prior art approaches. The smaller footprint permits the close packing of high directivity elements in small arrays increasing the option for controlling directivity and reducing side lobes. The reduced energy and small footprint also permit a degree of control over potentially injurious and annoying sounds of high intensity.

BRIEF DESCRIPTION OF THE DRAWINGS

These and other attributes of the invention will become more clear upon a thorough study of the following description of the best mode for carrying out the invention, particularly when reviewed in conjunction with the drawings, wherein.

BEST MODE FOR CARRYING OUT THE INVENTION

Figure 1:
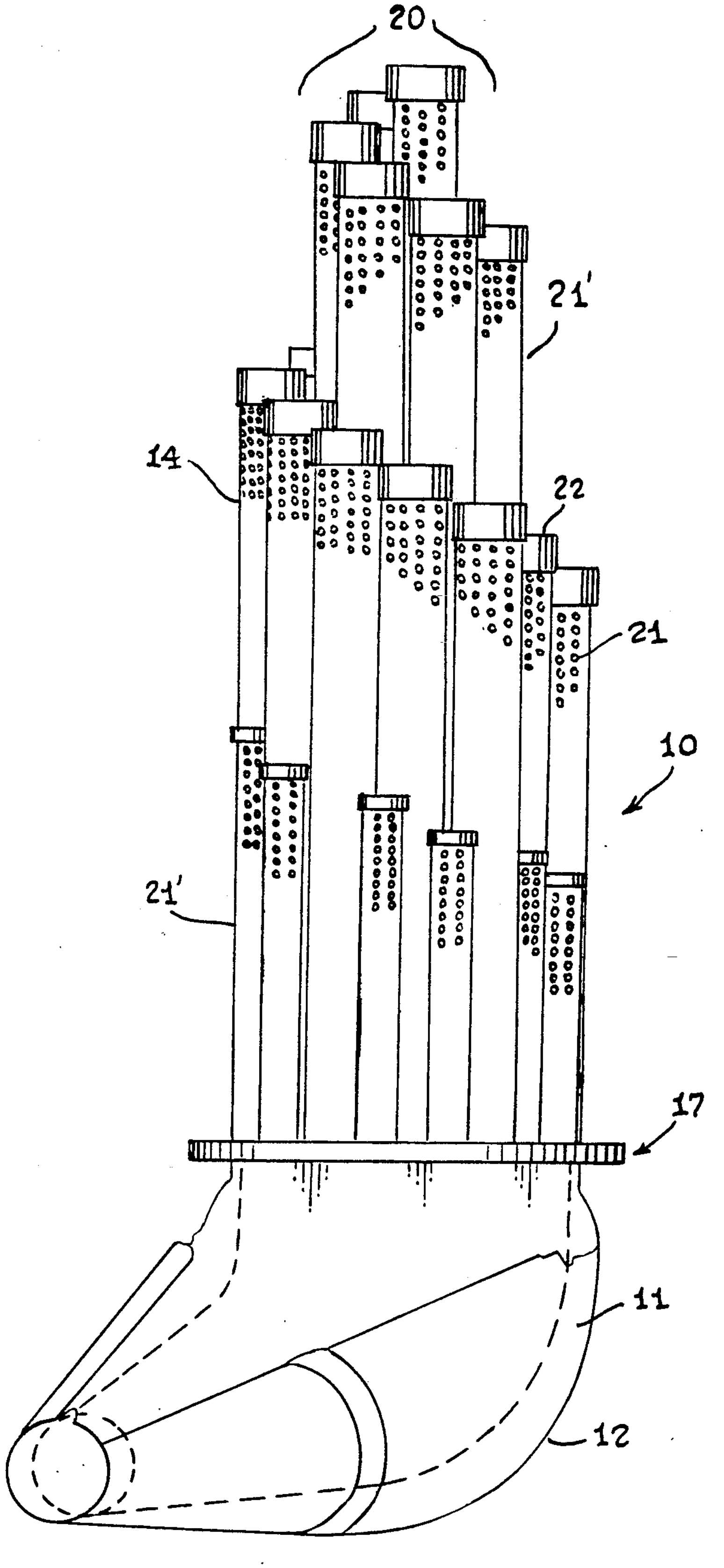
FIG. 1 is a perspective view of one embodiment of the invention.

As can be seen by reference to the drawings, and in particular to FIG. 1, the highly directional sound projector and receiver apparatus that forms the basis of the present invention is designated generally by the reference numeral (10). The apparatus (10) comprises an acoustic unit (11), a sound insulation unit (12), a support unit (13), and a tube array unit (14). These units will now be described in seriatim fashion.

Figure 2:
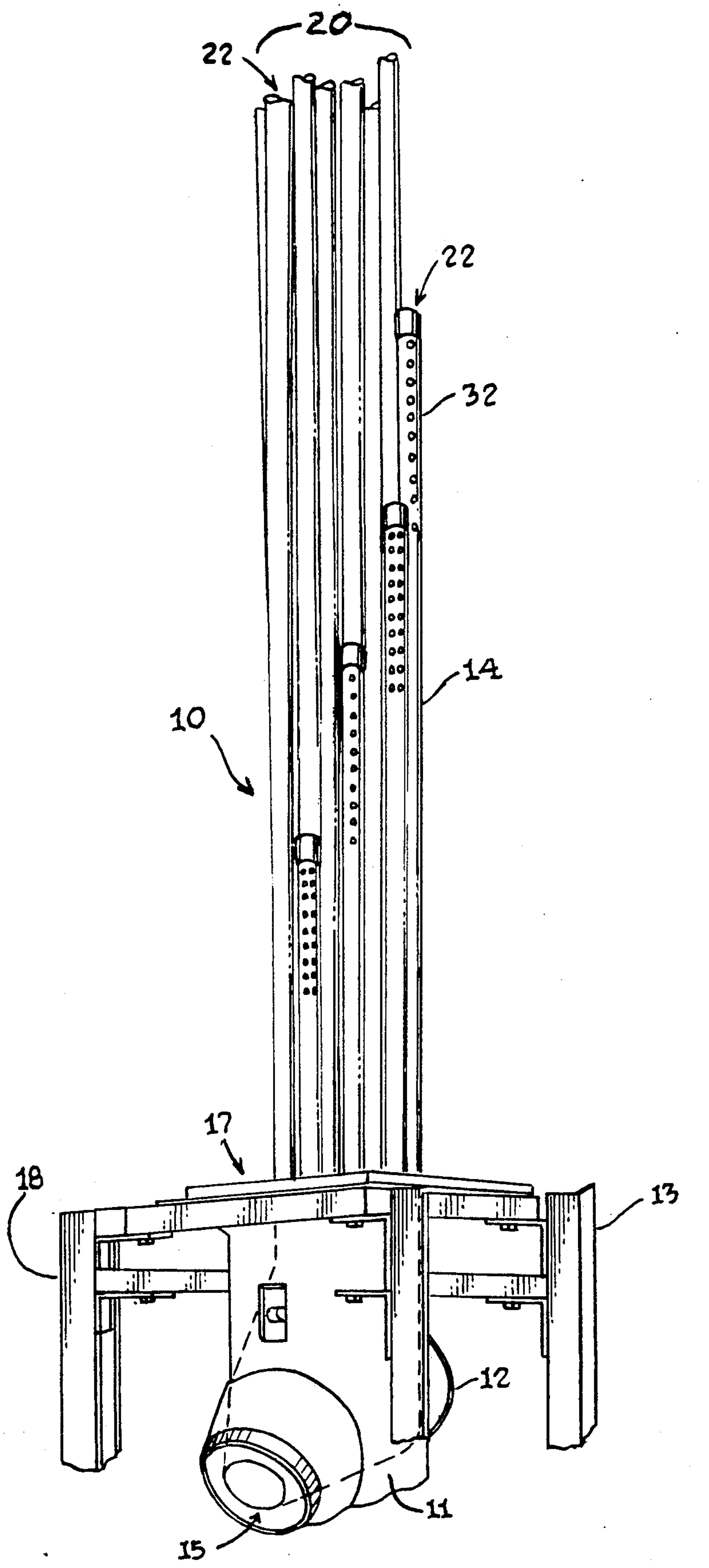
FIG. 2 is a perspective view of another embodiment of the invention.

As shown in FIGS. 1 and 2, the acoustic unit (11) is depicted in phantom and comprises a conventional high power acoustic driver (15), or in the alternative, an acoustic detector (15'), which is surrounded by the sound insulation unit (12). The sound insulation unit (12) comprises a sound insulation barrier (16) which envelopes the periphery of the acoustic sound source (15) such that the mouth of the sound source (15) is directed into one end of the tube array unit (14).

The support unit (13) comprises a platform (17) forming a transition zone between the sound projector source unit (11) and the tube array unit (14) wherein the outlet end of the sound source (15) is operatively engaged on one side of the support unit (13) while the inlet end of the tube array (14) is operatively engaged on the other side of the support unit (13).

As shown in FIG. 1, the platform (17) may be formed as an independent structural component which requires a separate supporting structure (not shown). Or, as depicted in FIG. 2, the platform (17) may be formed as an integrated support structure (18) capable of providing support for the entire apparatus (10).

In both versions of the preferred embodiment depicted in FIGS. 1 and 2, the tube array unit (14) comprises in general, a bundle (20) of closely spaced individual tubes (21, 22) arranged in a geometric pattern. The length and diameter of the tubes will be varied for different applications. The individual tubes are provided only near their respective outlet ends with a plurality of ports (22) whose spacing and arrangement are designed specifically to provide effective side lobe reduction or suppression.

In the first version of the preferred embodiment depicted in FIG. 1, the tube array (14) comprises a bundle (20) of relatively short and wide individual tubes (21) preferably fabricated from PVC tubing for reasons that will be explained further on in the specification.

In addition, in this first version, the individual tubes (21) are arranged into a plurality of distinct groups of tubes (21, 21") having the same internal diameter within the individual groups, but different internal diameters relative to the other groups of tubes. Furthermore, the relatively short squat configuration of the tube array (14) of the embodiment of FIG. 1 is particularly well suited for use as a sound source requiring higher power levels, wherein the relatively large diameter tubes (21) will reduce losses caused by attenuation within the tubes (21).

In the second version of the preferred embodiment depicted in FIG. 2, the tube array (14) comprises a bundle of relatively long and narrow individual tubes (22) arranged int a spiral configuration wherein the longest tubes are concentrated in the center of the spiral. It should be noted however, that while test results have indicated that a random areal distribution of tube lengths will enhance side lobe reduction characteristics, the conventional geometric geometry is easier to build and performs almost as well. In addition, in this particular version, all of the individual tubes (22) have virtually the same internal diameter.

In this particular version, the apparatus is used as a highly directive sound receiver whose goal is to obtain the optimum signal to noise ratio from a narrow direction of interest and the lower efficiencies resulting from smaller diameter tubes (22) and port (32) will not limit many detection applications.

It should also be noted that in an alternate version of the invention, (not shown), the tube array (14) comprises a bundle (20) of generally tapered tubes having their narrow end disposed at the uppermost end of the respective tubes to further enhance the pinpoint directional sensitivity of the apparatus (10).

Figure 3:
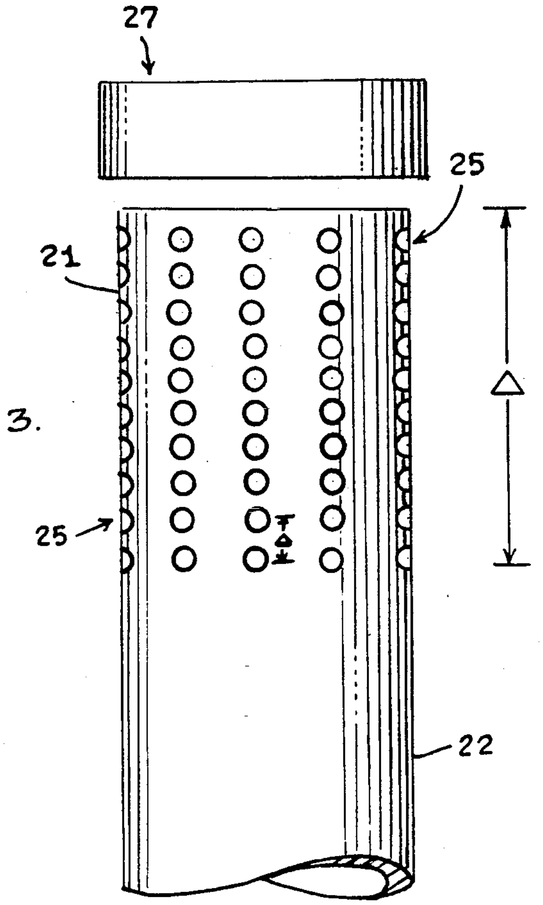
FIG. 3 is an isolated detail view of the upper end of one of the sound projecting tubes.

Turning now to FIG. 3, it can be seen that the upper end of each of the individual tubes (21, 22) are provided with a plurality of discrete ports (25) arranged in a pattern to create a phased source region distributed along a tube length, thus permitting a greatly reduced number of separate tubes In addition, this approach retains the advantages of side lobe reduction provided by a large number of source openings distributed along a given length. Furthermore, the three dimensional distribution of ports will help reduce wind noise, while other materials employed will help to reduce rain impact noise, as compared with conventional dish type receivers.

As can also be seen by reference to FIG. 3, the discrete ports (25) are distributed over the uppermost segments Δ of the total length "1" of the tube (21, 22). The preferred value of Δ does not exceed six inches. In addition, as can be seen by reference to FIGS. 1 through 3, the number, spacing, and array of the discrete ports (25) may vary among the tube bundles (20) depending upon the particular application in which the apparatus is employed.

Figure 4:
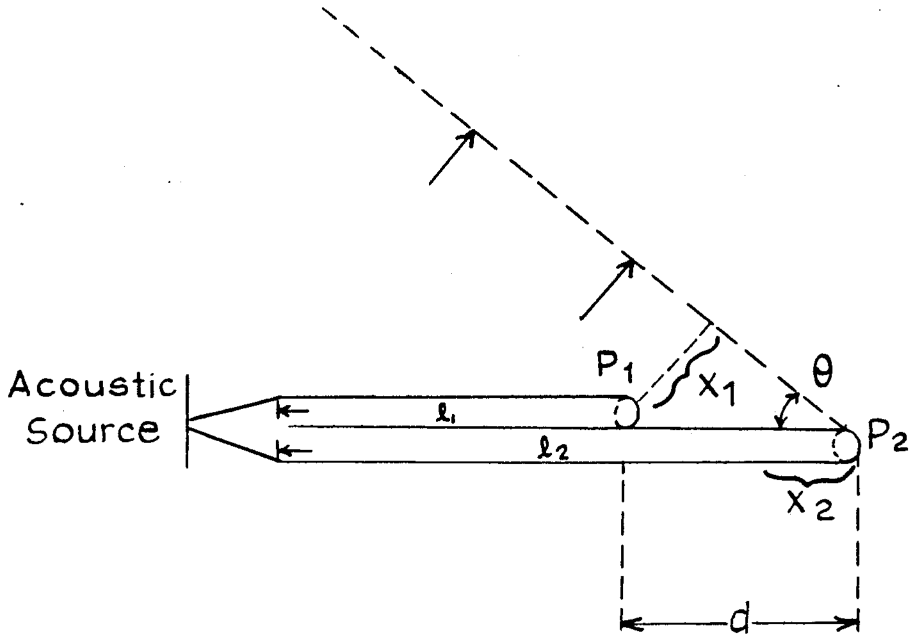
FIG. 4 is a pictorial representation of the theoretical operation of the apparatus.

In FIG. 4, approximate the operation of the projector by considering a line of acoustic omnidirectional sources each separated by a distance, "d", along the line. If the diameter of each tube is small compared with the wavelength of the sound being radiated, each tube will act, for practical purposes, as an omnidirectional source. in fact, the test model does not have the sources distributed along a line, but rather over an area. The average area is small compared with the total length.

Hypothetically, the following analysis should be approximately correct if the average area along the axis of the tube is smaller than a wavelength. Another assumption is that "c", the speed of sound, within the tubes and in the medium is the same. FIG. 4 shows the geometry of the system considering two tubes. We also assumed that no attenuation or reflections occur within the device. Tests indicate that these assumptions are realistic.

For the front shown as a dashed line, a wave launched from the tube $T_1$ (port $P_1$) travelled a distance $x_1$ and the corresponding phase of the wave for $T_2$ (port $P_2$) must have travelled a distance $x_2$ within the tube.

Thus, $x_1$ and $x_2=d \cos\phi$. The path difference between the two pressure waves (in phase at the $P_1$ location is:

$$d-x_2=d-d\cos\phi=d(1-\cos\phi).$$

For a projector of length "L" employing a total of "N" tubes, the total length is $$L=(N-1)d.$$

We can write the phase angle $\phi$ where $k=2\pi/\lambda$ as the product $k(d-x_2)$. Substituting the expressions for $d-x_2$ and "L" from above, this may be written as:

$$\phi=k\,d(1-\cos\phi)=kL/(N-1)\,(1-\cos\phi).$$

The pressure is the vector sum of the contributions for the N tubes, the contributions differing successively by the phase angle $\phi$. For this situation, the pressure $dP(\phi)$ at a distant station for a radiated pressure $\Delta Po$ is $$\Delta P(\phi) = \Delta Po\frac{\sin(N\phi/2)}{\sin(\phi/2)}$$

At very low frequencies ($\ell<<\lambda$) the directional response is negligible and $$\Delta P(\phi) \propto \Delta PoN.$$

However, when $\ell>\lambda$significant directivity is obtained.

For high directivity, the distributed source axis length (1) should be a number of wavelengths of the emitted sound. For good side lobe reduction, the spacing (s) along the axis of the individual sound ports (25) should be a small fraction of a wavelength (e.g., $s<\lambda/10$).

Turning once more to FIG. 3, it can be seen that this invention also contemplates the use of caps (27) on the ends of the individual tubes (21, 22), particularly in areas which experience large amounts of precipitation in the form of rain or snow. However, test results have proven that the sensitivity between the capped and uncapped tubes (21, 22) depending upon the launch angle can vary by as much as −20dB, with the uncapped tubes (21, 22) producing far superior results.

The basic apparatus (10) thus far described therefor, comprises a highly directive sound source design that should be valuable for a variety of applications. For example, the tapered four tube array could be mounted on an emergency vehicle and used to provide directions to the public. Guiding persons in the aftermath of an earthquake, warning swimmers on beaches, warning skiers of avalanche hazards, and crowd control are examples of applications. Outdoor amphitheaters could help insure that minimum sound is radiated out of the theater and produce annoyance to surrounding communities.

Other designs implemented provide high power with good side lobe reduction. These are ideal for use on remote sensing applications. The implementation, consisting of an ensemble of large diameter tubes surrounded by smaller diameter tubes all open at the end, where smaller ports distribute the sound and operated efficiently with good side lobe reduction.

These features described above can also be applied for sound reception and acoustic detectors. Incorporating these design features should increase signal-to-noise ratios under adverse conditions involving wind, rain, and local noise.

Having thereby described the subject matter of the present invention, it should be apparent that many substitutions, modifications and variations of the present invention are possible in light of the above teachings. It is therefore to be understood that the invention as taught and described herein is only to be limited to the extent of the breadth and scope of the appended claims.

We claim:

1. An acoustic apparatus equally suitable for use in both a sound projector mode and a sound receiver mode; wherein the acoustic apparatus comprises
   - an acoustic unit comprising an acoustic driver when the apparatus is used in the sound projector mode; and, an acoustic detector when the apparatus is used in the sound receiver mode;
   - a support unit including a platform having one side operatively attached to the acoustic unit; and,
   - a tube array comprising a bundle of individual sound tubes wherein each individual sound tube is secured on their lower ends to the platform and each individual tube only provided on their upper ends with a plurality of discrete sound ports to both create a phased source region distributed along a given tube length when used as a sound detector; and, to provide effective side lobe suppression when used as a sound projector.

2. The apparatus as in claim 1 wherein the number spacing and array of the plurality of spaced sound ports on the individual tubes in said bundle are uniform.

3. The apparatus as in claim 1 wherein said at least one sound tube is provided with an end cap.

4. The apparatus as in claim 1 wherein each of the individual tubes in said bundle has a different length "L".

5. The apparatus as in claim 4 wherein the value of "L" for each individual tube increases by a fraction of a wavelength "λ" as determined by a known medium and frequency.

6. The apparatus as in claim 5 wherein, said sound tubes have a spacing "s" between the axis of the individual sound ports, said spacing should be a small fraction of a wavelength "λ" as determined by a known medium and frequency.

7. The apparatus as in claim 6 wherein the value of "s" is less than $\lambda/10$.

8. The apparatus as in claim 1; wherein, each of the individual tubes in the bundle have the same inside diameters.

9. The apparatus as in claim 1; wherein in the sound detector mode the individual tubes in said bundle are divided into groups of tubes, wherein each group of tubes has a different inside diameter than the inside diameter of the tubes in the other groups, wherein the larger diameter tubes are greater in length than the smaller diameter tubes.

* * * * *